US008455050B2

(12) United States Patent
Hata et al.

(10) Patent No.: US 8,455,050 B2
(45) Date of Patent: Jun. 4, 2013

(54) MANUFACTURING APPARATUS AND MANUFACTURING METHOD FOR ALINED CARBON NANOTUBES

(75) Inventors: Kenji Hata, Ibaraki (JP); Satoshi Yasuda, Ibaraki (JP); Motoo Yumura, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 510 days.

(21) Appl. No.: 12/525,719

(22) PCT Filed: Feb. 4, 2008

(86) PCT No.: PCT/JP2008/051749
§ 371 (c)(1),
(2), (4) Date: Nov. 10, 2009

(87) PCT Pub. No.: WO2008/096699
PCT Pub. Date: Aug. 14, 2008

(65) Prior Publication Data
US 2010/0062157 A1    Mar. 11, 2010

(30) Foreign Application Priority Data
Feb. 5, 2007    (JP) .................................. 2007-025161

(51) Int. Cl.
*C23C 16/00*    (2006.01)

(52) U.S. Cl.
USPC ..................... 427/249.1; 427/248.1

(58) Field of Classification Search
USPC ........................................... 427/249.1, 248.1
See application file for complete search history.

(56) References Cited

U.S. PATENT DOCUMENTS

| 7,338,684 | B1 * | 3/2008 | Curliss et al. ................. 427/180 |
| 2001/0009693 | A1 * | 7/2001 | Lee et al. .................... 427/249.1 |
| 2004/0149209 | A1 | 8/2004 | Dai et al. |
| 2005/0287689 | A1 * | 12/2005 | Iwaki et al. ..................... 438/22 |

FOREIGN PATENT DOCUMENTS

| EP | 1 787 955 | 5/2007 |
| JP | 2001-234341 | 8/2001 |
| JP | 2001234341 A * | 8/2001 |
| JP | 2004-523460 | 8/2004 |
| JP | 2007-261839 | 10/2007 |
| WO | 02/081366 | 10/2002 |
| WO | 2006/011655 | 2/2006 |

OTHER PUBLICATIONS

Hata et al. Water-Assisted Hightly Efficient Synthesis of Impurity-Free Single-Walled Carbon Nanotubes, Nov. 19, 2004, Science, vol. 306 pp. 1362-1364.*
An et al. Tribological properties of hot-pressed alumina CNT composits, 2003, Wear, pp. 677-681.*
Hata, Kenji et al., "Water-Assisted Highly Efficient Synthesis of Impurity-Free Single-Walled Carbon Nanotubes" Science, Nov. 19, 2004, vol. 306, pp. 1362-1364.
International Search Report mailed Apr. 22, 2008 for International Application No. PCT/JP2008/051749.

* cited by examiner

*Primary Examiner* — Kelly M Gambetta
(74) *Attorney, Agent, or Firm* — Wenderoth, Lind & Ponack, L.L.P.

(57) ABSTRACT

An apparatus (CVD apparatus (1)) having a reaction chamber (3) for accommodating a substrate (2) formed with a metal catalyst film and means (gas supply pipes (5, 6)) for supplying a feedstock gas (9) and a catalyst activating material (10) into the reaction chamber (3) for manufacturing CNTs aligned in a direction perpendicular to the catalyst film surface (2a) of the substrate (2), wherein the means for supplying the feedstock gas (9) and the catalyst activating material (10) have a plurality of ejection holes placed at positions facing the catalyst film surface (2a) of the substrate (2), and the ejecting direction of the ejection holes is adjusted to the direction of alignment of CNTs grown from the metal catalyst film. This can provide a manufacturing technology for CNTs capable of mass-producing aligned CNTs at lower cost.

2 Claims, 9 Drawing Sheets

MANUFACTURING APPARATUS AND MANUFACTURING METHOD FOR ALINED CARBON NANOTUBES

TECHNICAL FIELD

The present invention relates to a manufacturing apparatus and a manufacturing method for aligned carbon nanotubes capable of manufacturing the aligned carbon nanotubes at high efficiency.

BACKGROUND ART

In recent years, carbon nanotubes having specific physical, chemical, and mechanical properties (hereinafter also referred to as CNT) have attracted attention. Particularly, since CNT aggregate comprising a plurality of CNTs aligned in an identical direction have a property different between the direction of orientation and the direction perpendicular thereto, that is, anisotropy with respect to electric properties (for example, electric conductivity), optical properties (for example, transmittance), and mechanical properties (for example, bending property), such aligned CNTs have a pronounced trend to be applied to devices for micro-machines (MEMS) or electronic devices. Particularly, in the aggregate of aligned CNTs, ions can easily diffuse among the aligned CNTs. Therefore, it is useful also as electrode materials for high power super capacitors.

For promoting the practical use of the aligned CNTs in the fields described above, it is important to improve the mass productivity of the aligned CNTs. The present inventors have found that an aligned CNT aggregate which is excellent in purity, specific surface area, and alignment and, in addition, increased remarkably in the size can be obtained by the presence of a small amount of water in a reaction atmosphere in the CNT growing method by a chemical vapor deposition method (hereinafter also referred to as a CVD method) when compared with the conventional method, and have reported the same in Non-Patent Document 1.

In addition, a technique of supplying water vapor together with a feedstock gas into a reaction container in the growing step of a vertically aligned CNT film has been proposed in Patent Document 1.

Non-Patent Document 1: Kenji Hata, et al., Water-Assisted Highly Efficient Synthesis of Impurity-Free Single-Walled Carbon Nanotubes, SCIENCE, 2004 Nov. 19, vol. 306, p. 1362-1364.

Patent Document 1: JP-A-2007-261839

SUMMARY OF THE INVENTION

Problems that the Invention is to Solve

However, the techniques described in the documents above still remain as the technique in the laboratory scale and it has been demanded for the development of a manufacturing apparatus and a manufacturing method for aligned CNTs capable of further decreasing the manufacturing cost and attaining further effective mass production for extending and promoting the industrial use of the aligned CNTs.

The invention has been achieved with the view point described above and a principal object thereof is to provide a manufacturing apparatus and a manufacturing method for aligned CNTs capable of mass producing aligned CNTs at a further reduced cost.

Means for Solving the Problems

Figure 1:
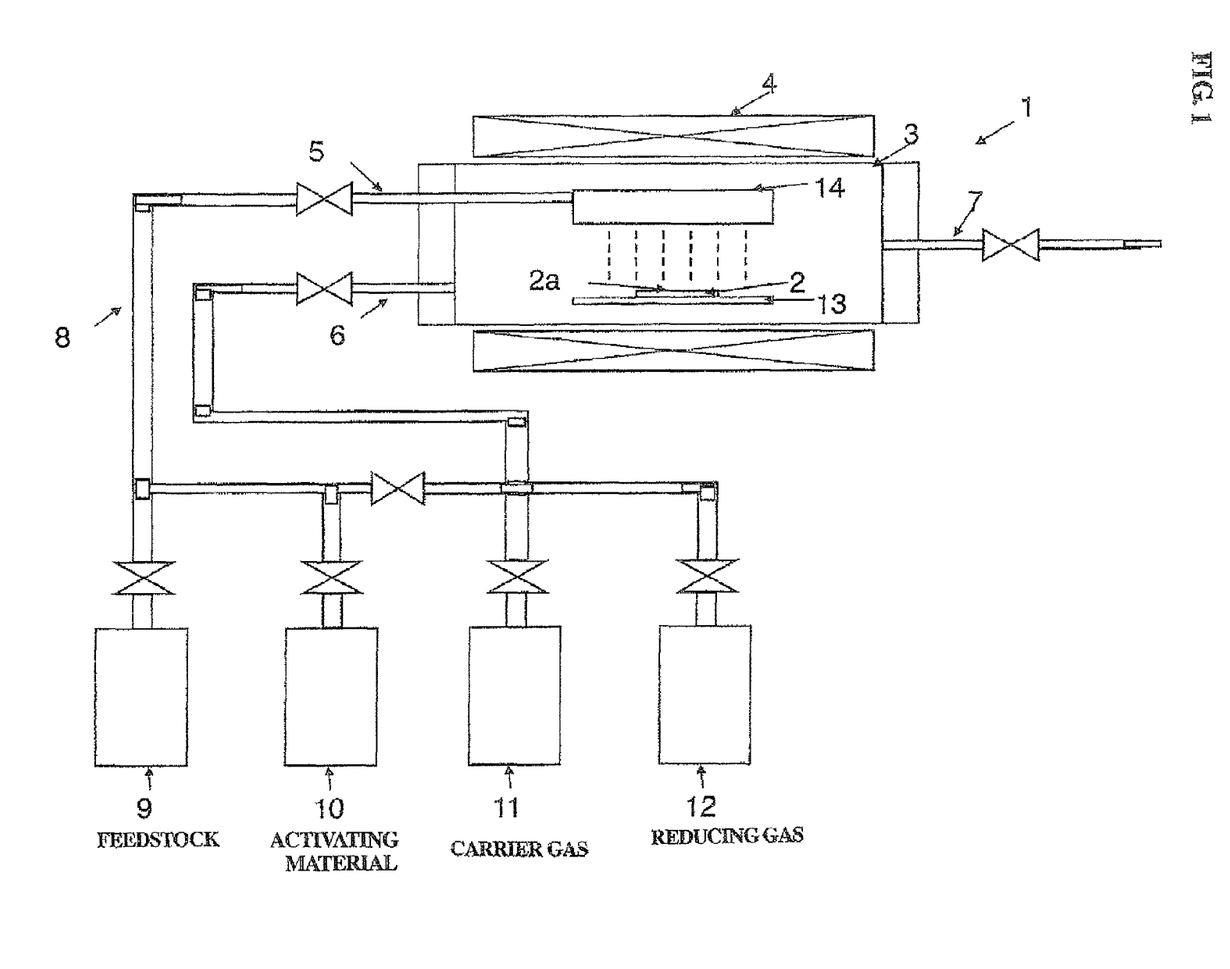
FIG. 1 is a side elevational view schematically showing a CNT manufacturing apparatus according to the invention.

For solving the subject described above, the present invention provides an apparatus (CVD apparatus 1), as shown in FIG. 1, including a reaction chamber 3 to accommodate a substrate 2 with a metal catalyst film, means for supplying a reducing gas, a feedstock gas 9, and a catalyst activating material 10 into the reaction chamber 3 (gas supply pipes 5, 6) for manufacturing CNTs aligned in the direction perpendicular to a catalyst film surface 2a of the substrate 2, wherein the supply means for the feedstock gas 9 and the catalyst activating material 10 has a plurality of ejection holes 22 disposed at positions facing the catalyst film surface 2a of the substrate 2 (FIG. 3), and the ejecting direction of the ejection holes 22 is adjusted to the direction of alignment of CNTs grown from the metal catalyst film.

Figure 2:
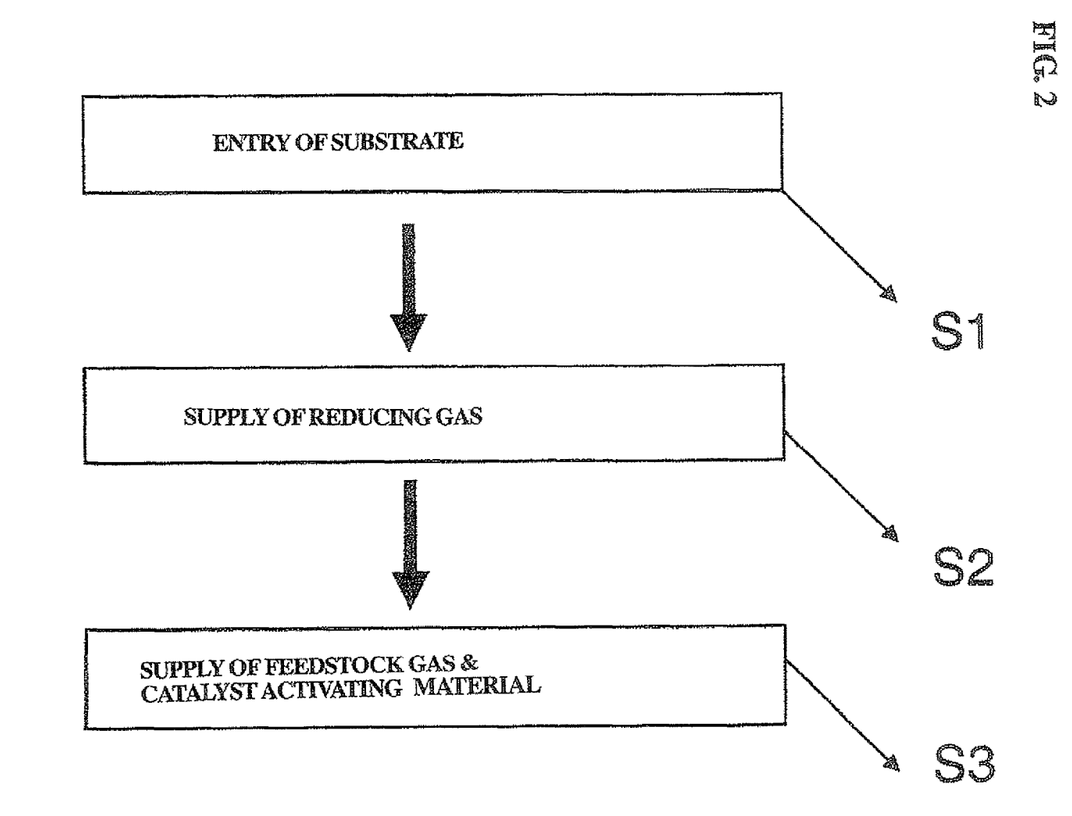
FIG. 2 is a flow chart schematically showing a CNT manufacturing method according to the invention.

Further, the method of manufacturing CNTs of supplying the reducing gas 12, a feedstock gas 9 and a catalyst activating material 10 to the inside of the reaction chamber 3 for accommodating the substrate 2 formed with a metal catalyst film, and manufacturing CNTs aligned in a direction perpendicular to the catalyst film surface 2a of the substrate 2 includes a first step S1 for disposing the substrate 2 in the reaction chamber 3, a second step S2 for supplying the reducing gas 12 in the reaction chamber 3 where the substrate 2 is disposed, and a third step S3 of supplying the feedstock gas 9 and the catalyst activating material 10 into the reaction chamber 3 where the substrate 2 is disposed wherein, in the third step, the feedstock gas 9 and the catalyst activating material 10 are supplied from a plurality of ejection holes 22 disposed at a position facing the catalyst film surface 2a of the substrate 2 with the ejecting direction thereof being adjusted to the direction of alignment of CNTs grown from the metal catalyst film. Also, an oxygen-containing compound is used as the catalyst activating material 10.

According to the invention as described above, since the catalyst activity is improved and the life time is extended, growth of the aligned CNTs can be continued for a long time and, in addition, since the feedstock gas and the catalyst activating material are consumed with small loss, a remarkable effect for mass production of the aligned CNTs at a reduced cost can be provided.

DESCRIPTION OF THE REFERENCE NUMERALS AND SIGNS

1 CVD apparatus
2 substrate
2a catalyst film surface
3 reaction chamber
4 heating means
5,6 gas supply pipe
14 shower head
21 opening surface of ejection holes
22 ejection holes
31 aligned CNT aggregate
S1 first process
S2 second process
S3 third process

DETAILED DESCRIPTION OF THE INVENTION

A best mode for practicing the present invention is to be described specifically with reference to the appended drawings.

As shown in FIG. 1, a CVD apparatus 1 of the invention has a tubular reaction chamber 3 comprising, for example, quartz glass for accommodating a substrate 2 carrying a metal catalyst thereon, and heating means 4 comprising, for example, a resistance heating coil disposed so as to externally surround the reaction chamber 3.

Two gas supply pipes 5, 6 opened to the reaction chamber 3 are connected at one end wall of the reaction chamber 3, and a gas exhaust pipe 7 opened to the reaction chamber 3 is connected to the other end wall of the reaction chamber 3. Then, a feedstock gas supply portion 9, a catalyst activating material supply portion 10, a carrier gas supply portion 11, and a reducing gas supply portion 12 are connected by way of joining-branching pipeline 8 to the two gas supply pipes 5, 6.

At a lower position in the reaction chamber 3, a substrate holder 13 holding the substrate 2 with the catalyst film surface 2a upwarded is placed and a shower head 14 is placed thereabove in which a plurality of ejection holes are arranged at a uniform density. The shower head 14 is connected to the downstream end of the gas supply pipe 5 and the ejection holes are placed at a position facing the catalyst film surface 2a of the substrate 2 placed on the substrate holder 13. Further, each of the ejection holes is placed such that the ejection axis is directed perpendicular to the catalyst film surface 2a of the substrate 2. That is, the direction of a gas stream ejected from the ejection hole of the shower head 14 is approximately perpendicular to the catalyst film surface 2a of the substrate 2.

In this embodiment, each ejection axis of the ejection holes (gas jetting direction) is directed in perpendicular to the catalyst film surface 2a of the substrate 2, but this is an embodiment adopted generally as an optimal design to adjust the direction of the gas stream ejecting from the ejection hole to the direction of alignment of CNTs growing vertically from the catalyst film surface 2a of the substrate 2. That is, the structure of the shower head 14 including the distribution of the ejection holes and the angle of the ejection axis may be different provided that the gas stream reaching the catalyst film surface 2a of the substrate 2 is uniform within a practically acceptable range, and that the gas stream is not hindered by the growing CNTs, and it is not restricted to this embodiment. Further, the arrangement for the substrate 2, the substrate holder 13, and the shower head 14 are not restricted to that of this embodiment as long as the relation described above can be satisfied.

Check valves, flow rate control valves, and flow rate sensors are placed at appropriate positions in both of the gas supply pipes 5, 6, the gas discharge pipe 7, and each of the supply portions 9 to 12, so that the feedstock gas, the catalyst activating material, the carrier gas, and the reducing gas are supplied each at a predetermined flow rate continuously or intermittently from both or one of the two gas supply pipes 5, 6 to the inside of the reaction chamber 3 according to a reaction process by properly controlling each of the flow rate control valves to on and off in accordance with the control signal from a not illustrated control device.

Another carrier gas supply portion (not illustrated) is disposed to the catalyst activating material supply portion 10, and the catalyst activating material is supplied together with a carrier gas, for example, helium.

According to the CVD apparatus 1 constituted as described above, a plurality of CNTs can be grown substantially in the same direction from the catalyst film surface 2a on the substrate 2 by blowing like a shower gases supplied from the joining-branching pipeline portion 8 through the gas supply pipe 5 from the ejection holes of the shower head 14 to the catalyst film surface 2a of the substrate 2, by sending the gas from the opening of the gas supply pipe 6 into the reaction chamber 3, or sending the same from both of the two gas supply pipes 5, 6.

As the feedstock gas used for the synthesis of the CNT in the CVD apparatus 1 according to the invention, hydrocarbons and, among all, lower hydrocarbons such as methane, ethane, propane, ethylene, propylene, and acetylene can be used in the same manner as in the conventional method. They may be used solely or two or more of them may be used in admixture.

The catalyst activating material to be in contact together with the feedstock gas with the catalyst film surface 2a has an effect of improving the activity of the catalyst or prolonging the life time of the catalyst by the addition to the growing atmosphere of CNT and, as a result, enables efficient growing of CNTs. The mechanism of such a function of the catalyst activating material is considered as described below. That is, in a usual CNT synthesis method not containing the catalyst activating material, fine catalyst particles are instantaneously covered with a carbon film and deactivated. On the other hand, according to the CNT synthesis method of the invention of incorporating the catalyst activating material in the atmosphere, it is considered that when the catalyst activating material is in contact with the catalyst film surface 2a, the catalyst activating material removes the carbon film that covers the fine catalyst particle to clean the surface texture of the catalyst and, as a result, activates the catalyst.

While water vapor have been known as the substance having such a function, this may be any substance having the function described above and, generally, any substance so long as it contains oxygen and does not give damages to the CNT at a growing temperature. In addition to the water vapor, use of oxygen-containing compounds having a low number of carbon atoms, for example, alcohols such as methanol and ethanol, ethers such as tetrahydrofuran, ketones such as acetone, aldehydros, acids, esters, nitrogen oxides, carbon monoxide, and carbon dioxide may be permitted depending on the reaction conditions.

The carrier gas filling the inside of the reaction chamber 3 may be any gas that does not react with the CNT and is inert at a growing temperature and, for example, helium, argon, hydrogen, nitrogen, neon, krypton, carbon dioxide, chlorine, or a gas mixture of them can be used.

The reducing gas may be any gas that acts on the metal catalyst and can promote fine particulation in a state adaptable to the glowing of the CNT and, for example, hydrogen, ammonia, or a gas mixture of them may be used.

As the material for the substrate 2, various kinds of materials well-known so far can be used depending on the application use of the CNT and, for example, sheet-like materials or plate-like materials comprising non-metals such as silicon and quartz glass, various metals, ceramics, oxides, etc. can be used.

As the catalyst film to be deposited to the substrate 2, well-known thin metal films used so far for the synthesis of the CNT, for example, iron chloride thin film, iron thin film, iron-molybdenum thin film, alumina-iron thin film, alumina-cobalt thin film, and alumina-iron-molybdenum thin film can be used.

For the formation of the catalyst film to the substrate 2, a method well-known so far, for example, a sputtering vapor deposition method can be used. Further, the catalyst film can be patterned to a desired shape by applying a well-known photolithographic technique.

For the atmospheric pressure and temperature during reaction, identical pressure range and temperature range with those in the conventional method are applicable.

For manufacturing aligned CNTs by the CVD apparatus 1 constituted as described above, a substrate 2 (for example, silicon wafer) previously formed with a metal catalyst film (for example, alumina-iron thin film) in a separate step and placed on the substrate holder 13 is at first inserted into the reaction chamber 3 which is filled with the carrier gas (for example, helium gas) and the reducing gas (for example, hydrogen) supplied from the other gas supply pipe 6 and heated to a predetermined temperature (for example, 750° C.) and kept at that temperature (first step S1).

Then, the reducing gas (for example, hydrogen) is supplied from the other gas supply pipe 6 into the reaction chamber 3 for a desired time (second step S2). The metal catalyst present on the catalyst film surface 2a is shaped into fine particles by the reducing gas and the metal catalyst is formed in such a state suited to the grow, for example, single-walled CNTs. By selecting an appropriate thickness of the metal catalyst film and conditions for the reducing reaction, fine catalyst particles with a diameter of several nanometer can be formed with a density of $1.0 \times 10^{11}$ (N/cm$^2$) to $1.0 \times 10^{13}$ (N/cm$^2$). The density is suitable to grow a plurality of CNTs aligned in the direction perpendicular to the catalyst film surface 2a.

Then, supply of the reducing gas and the carrier gas from the other gas supply pipe 6 is stopped or decreased as required (reaction condition), the feedstock gas (for example, ethylene) and the catalyst activating material (for example, water vapor) mixed with the carrier gas are supplied form the gas supply pipe 5, and blown from the shower head 14 to the catalyst film surface 2a of the substrate 2 (third step S3). Thus, CNTs are grown from the fine catalyst particles deposited to the substrate 2.

As described above, a plurality of the CNTs grown simultaneously from the catalyst film surface 2a on the substrate 2 grow in a direction perpendicular to the catalyst film surface 2a to constitute an aligned CNT aggregate with a substantially uniform height. In this case, the fine catalyst particles are attached to the catalyst film surface 2a and, to maintain the growth of the CNTs, it is necessary that the feedstock gas and the catalyst activating material efficiently diffuse in the grown aligned CNT aggregate and are continuously and stably supplied to the fine catalyst particles on the catalyst film surface 2a.

As described above, since the ejecting direction of the ejecting hole made in the shower head 14 is perpendicular to the catalyst film surface 2a in this case, the direction of a gas stream from the ejection hole approximately matches the alignment direction of CNTs perpendicular to the catalyst film surface 2a of the substrate 2, that is, in the direction parallel with the alignment of the plurality of CNTs under growing. Accordingly, the feedstock gas and the catalyst activating material are easily diffuse among a plurality of CNTs constituting the aligned CNT aggregate, and supplied uniformly, efficiently, and stably over the entire surface of the catalyst film surface 2a. Accordingly, the effect of the invention is provided, that is, the catalyst life time is extended by the catalyst activating material and the waste amount of the feedstock gas and the catalyst activating material is decreased and, as a result, CNTs can be manufactured in a remarkably great amount, at a reduced cost, and stably.

Figure 3:
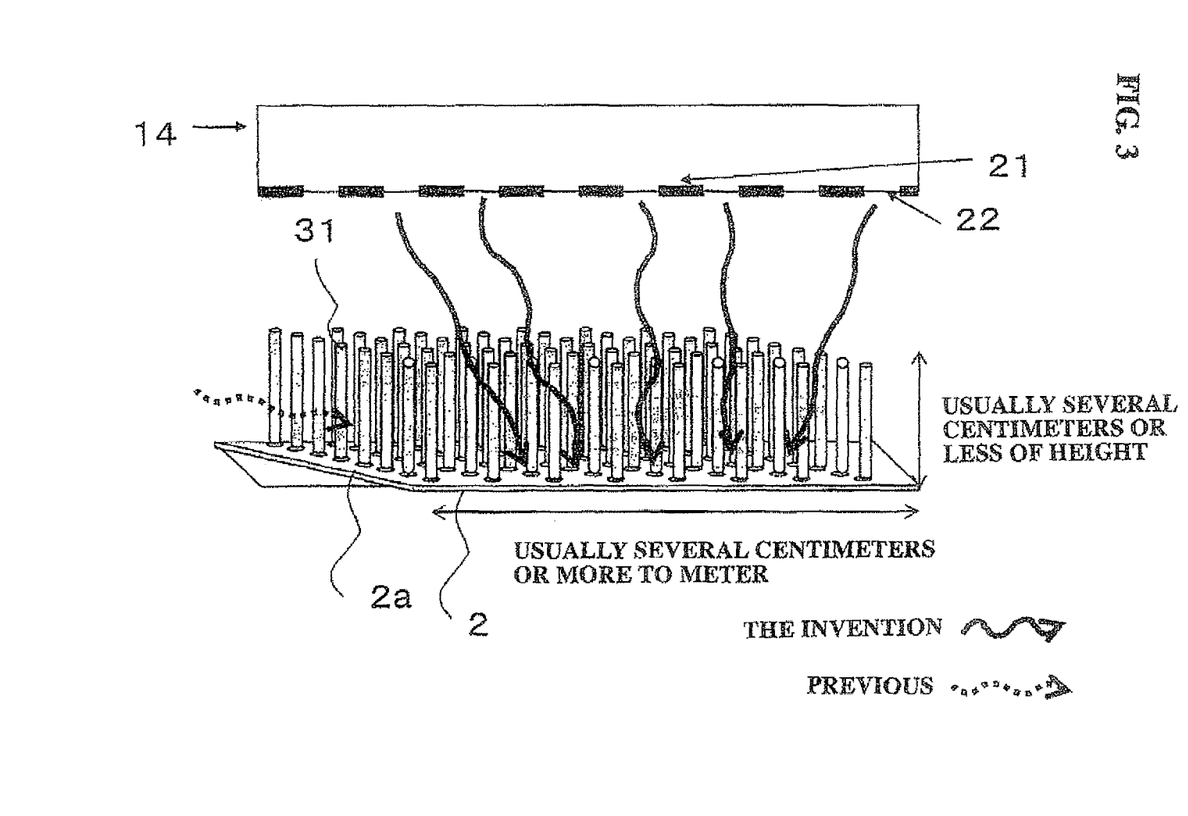
FIG. 3 is a schematic view showing the state where a catalyst activating material reaches a catalyst film surface.

As apparent from the effect of the invention described above, the ejecting direction of the ejection hole 22 made in the shower head 14 does not need to be in parallel with the direction of alignment of the CNTs., but it is sufficient that the ejecting direction is such that the feedstock gas and the catalyst activating material can easily diffuse through the growing aligned CNT aggregate 31 and can contact with the catalyst film surface 2a.

That is, it is sufficient if the ejecting direction of the ejection hole 22 meade in the shower head 14 is adjusted to the direction of alignment of the CNT.

Generally, since the optimum amount of the catalyst activating material necessary to grow CNTs at high efficiency is extremely small and the catalyst activating material is highly reactive, it is difficult to supply the catalyst activating material uniformly and efficiently over the entire surface of the catalyst film surface 2a by the method other than that of invention. When the catalyst activating material is supplied from the other gas supply pipe 6 opened in one end wall of the reaction chamber 3, the vector of the flow lines is in parallel with the catalyst film surface 2a of the substrate 2. Therefore, it is considered that the catalyst activating material can not contact uniformly over the entire surface of the catalyst film surface 2a because the catalyst activating material are interrupted by the grown CNT aggregate 31 or consumed at the catalyst film surface 2a.

The flow rate for each of the carrier gas, the reducing gas, the feedstock gas, and the catalyst activating material may be determined appropriately in accordance with reaction conditions such as the volume of the reaction chamber 3, and the kind of each of the gases.

Example 1

Description is to be made more specifically referring to specific examples and comparative examples.

Figure 4:
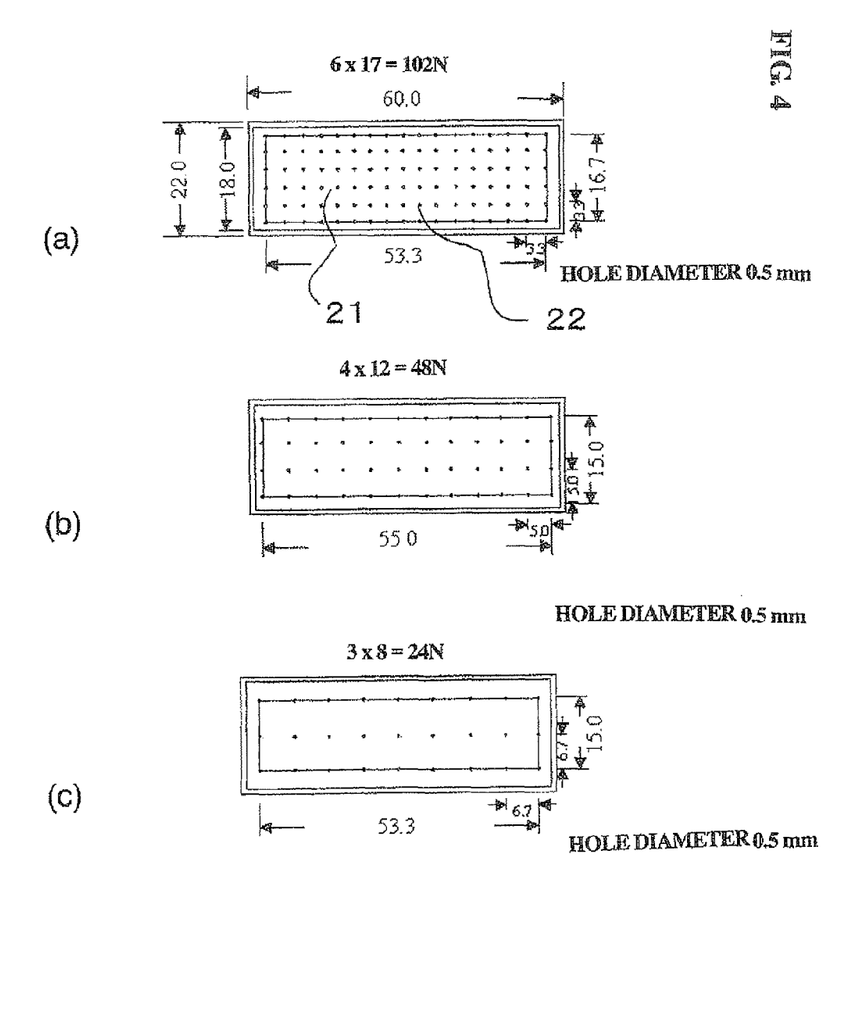
FIG. 4 is a plan view for an opening surface of ejection holes of a shower head.

A shower head 14 of a flat hollow box-like shape and made with a plurality of ejection holes 22 at the ejection hole opening surface 21 that faces the catalyst film surface 2a of the substrate 2 (shown in FIG. 4-a/surface size: 60.0 mm×16.7 mm, ejection holes diameter: 0.4 mm, number of ejection holes: 17 row×6 column each in equal distance) was disposed above the substrate 2 (20 mm×20 mm silicon wafer, with oxide film of 600 nm thickness) being spaced by 6 mm from the substrate 2. The specification of the shower head 14 is not restricted to this but it may be of a form shown in FIG. 4-b or FIG. 4-c and, depending on the case, may be those provided with a plurality of nozzles to a common pipe or those using a porous material having substantially infinite number of ejection holes.

A gas mixture of helium as a carrier gas (feed rate: 100 sccm) and hydrogen as a reducing gas (feed rate: 900 sccm) (total feed rate: 1000 sccm) was supplied from the other gas supply pipe 6 into the reaction chamber 3 (quartz tube of 30 mm diameter) and the inside of the reaction chamber 3 was heated to 750° C. A substrate 2 previously deposited with a catalyst film ($Al_2O_3$: 40 nm/Fe: 1.0 nm) by a sputtering vapor deposition method in a separate step was placed on the substrate holder 13 and placed to the downstream from the center of the reaction chamber 3 in the axial direction (first step S1). Then, a gas mixture of helium (100 sccm) and hydrogen (900 sccm) (total feed rate: 1000 sccm) was supplied to the inside of the reaction chamber 3 from the other supply pipe 6 and left for a predetermined time (6 min) while maintaining the state at 750° C. (second step S2).

With this process, the metal catalyst at the catalyst film surface 2a was shaped into fine particles and the catalysts were prepared into a state suited to grow single-walled CNTs.

Then, supply of the gas from the other supply pipe 6 was stopped and ethylene as the feedstock gas (feed rate: 10 sccm), and a carrier gas containing water vapor as the catalyst activating material (relative humidity: 23%, feed rate: 5 sccm) were supplied together with helium as the carrier gas (feed rate: 85 sccm) from one gas supply pipe 5 and both of them were blown from the ejection holes 22 of the shower head 14 to the catalyst film surface 2a of the substrate 2 (third step S3). According to the method of the invention, ethylene was thermally decomposed by the fine catalyst particles and CNTs were synthesized to obtain CNTs at 3.5 mg/cm$^2$.

On the other hand, according to the conventional method of directly supplying ethylene and the steam-containing carrier gas from the other gas supply pipe 6 opened in the inner surface of one end wall in the reaction chamber 3 into the reaction chamber 3 (not using shower head 14), CNTs at 3.3 mg/cm$^2$ could be obtained in 10 minutes at the feed rate of helium of 850 sccm, the feed rate of ethylene of 100 sccm, and the feed rate of the steam-containing carrier gas (relative humidity: 23%) of 50 sccm in a case of growing CNTs at 750° C. by using a substrate 2 deposited with a catalyst film ($Al_2O_3$: 40 nm/Fe: 1.0 nm (sputtering vapor deposition)) of the same specification as described above.

From the result, it has been found that the method of the invention of supplying both ethylene and the steam-containing carrier gas from the shower head 14 could provide the supply amount of ethylene, steam-containing carrier gas, and helium that is about 1/10 of that of the conventional method not using the shower head 14, and CNT yield that is a substantially equal to or more than that of the conventional method. That is, it has been found that the manufacturing cost for CNTs can be decreased greatly according to the invention.

In this case, when the distance between the catalyst film surface 2a of the substrate 2 placed on the substrate holder 9 and the ejection hole opening surface 21 of the shower head 14 is too large, the mixtured gas of the feedstock gas and the catalyst activating material diffuses before reaching the catalyst film surface 2a, and the effect of facing the shower head 14 to catalyst film surface 2a of the substrate 2 decreases. On the contrary, when the distance is too small, the space to grow the CNT to a large height is reduced and, at the same time, the gas mixture of the feedstock gas and the catalyst activating material hits intensively to the surface opposed to the ejection hole 22 of the shower head 14, so that this also decreases the effect of facing the ejection hole opening surface 21 of shower head 14 to the catalyst film surface 2a of the substrate 2. That is, it is necessary that the distance between the opening surface 21 of the ejection hole of the shower head 14 and the catalyst film surface 2a of the substrate 2 is determined properly while considering the relationship between the area of the shower head 14 and the distribution density of the ejection holes 22, and the aimed growing height of the CNT.

While the ejection hole opening surface 21 and the catalyst film surface 2a are preferably facing each other, they do not have to be always opposed to each other and, even when the centers of the shower head and substrate are offset within a certain range, the effect of the invention, that is, the ability to continue the growth of the CNTs for a long time emerges.

Figure 5:
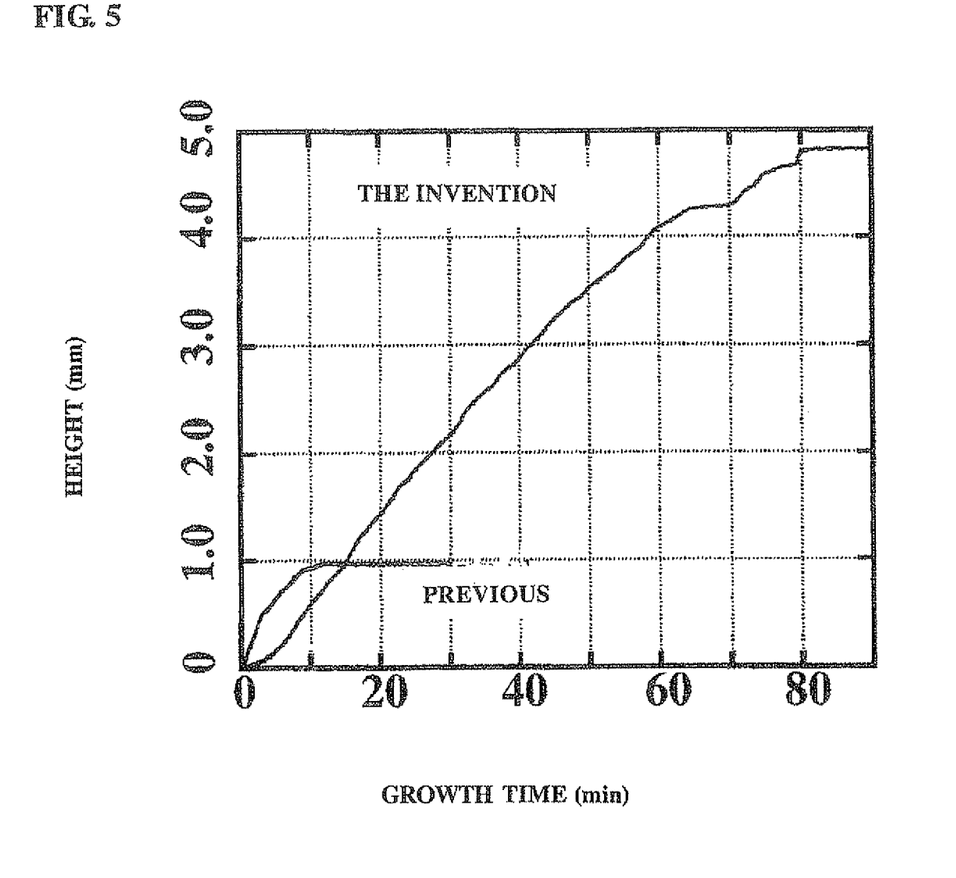
FIG. 5 is a graph comparing a relation of the growing time and the height of an aligned CNT aggregate when water vapor is used as a catalyst activating material between the method of the present invention and an conventional method.

FIG. 5 shows a relation between the growth height and the growth time of the aligned CNT aggregate in the method of the invention of supplying the feedstock gas and the catalyst activating material from the shower head 14 to the catalyst film surface 2a of the substrate 2 and in the conventional method of not using the shower head 14 at all. In this case, the growing height of the aligned CNT aggregate can be measured, for example, by directly observing the aligned CNT aggregate by an optical system. According to the method of the invention, the CNT grows continuously even when it exceeds 80 minutes, whereas growing reaches a plateau in about 10 minutes according to the conventional method and it has been found that the life time of the catalyst can be extended by the method of the invention. The limit of the growth height in FIG. 5 by the method of the invention is due to the initial setting for the distance between the ejection hole opening face 21 of the shower head 14 and the catalyst film surface 2a of the substrate 2, and further growth of the CNT can be expected in a case of constituting such that the shower head 14 elevates with the growth of the CNT.

Figure 6:
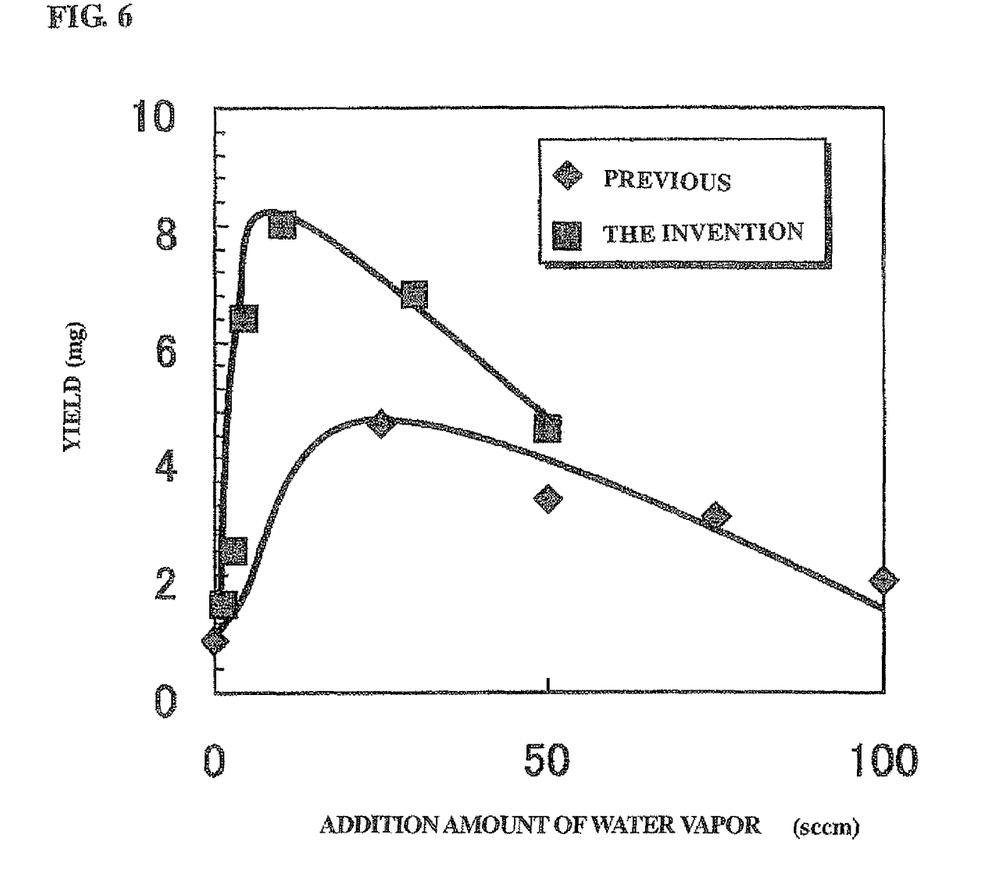
FIG. 6 is a graph comparing the CNT yield when the addition amount of the water content is changed between the method of invention and the conventional method.

FIG. 6 shows the result of measuring the CNT yield when the addition amount of water vapor (relative humidity: 23%) was changed in the method of the invention of supplying the water vapor (catalyst activating material) and ethylene (feedstock gas) from the shower head 14 and in the conventional method of not using the shower head 14 at all. According to this, while the fluctuation of the yield upon changing the addition amount of water vapor was moderate in the conventional method, it was abrupt in the method of the invention. Further, the maximum yield was increased by about 60% in the method of the invention compared with that of the conventional method, and the addition amount of water vapor at the maximum yield according to the method of the invention was about ½ that of the conventional method. This shows that the method of the invention of blowing the feedstock and the catalyst activating material from the shower head 14 placed at a position facing the catalyst film surface 2a of the substrate 2 to the catalyst film surface 2a has higher efficiency to use the feedstock gas and the catalyst activating material and the feedstock gas and the catalyst activating material are consumed with less loss compared with the conventional method of not using the shower head 14.

Figure 7:
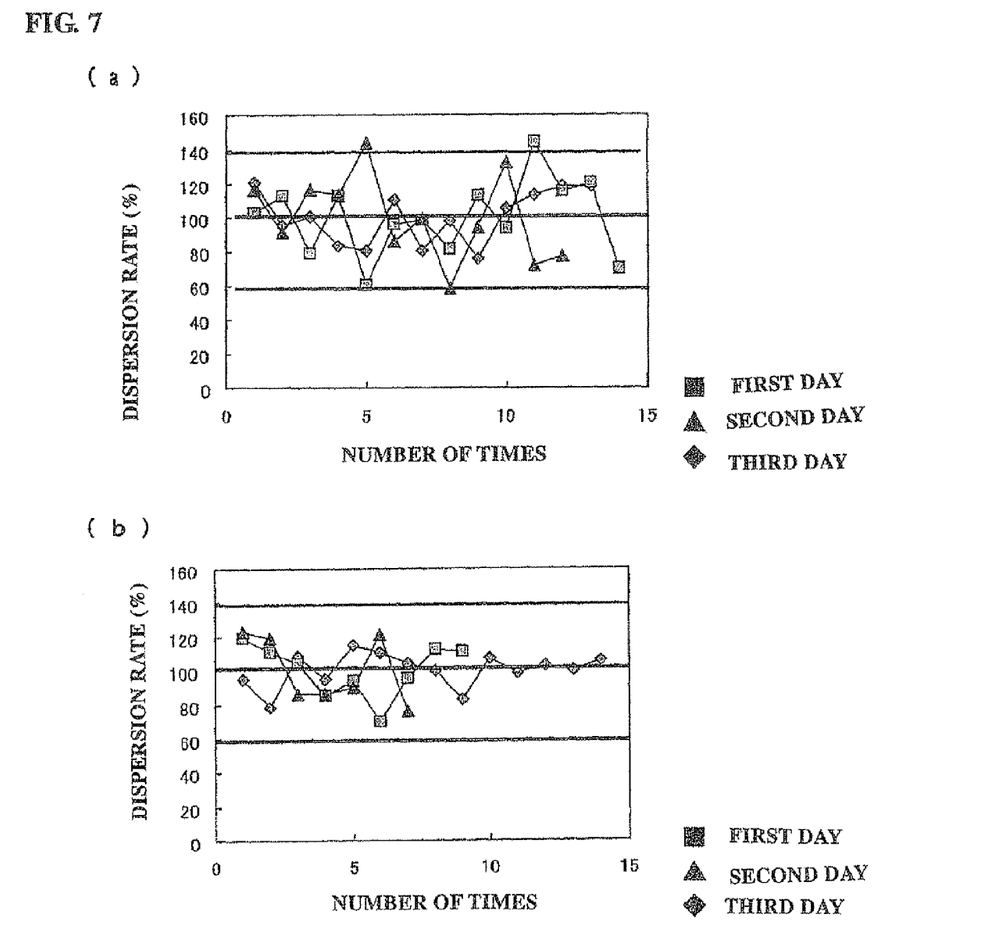
FIG. 7 is a graph comparing the variation of yield on every time relative to an average value upon repeating growing for several times between the method of the invention and the conventional method.

FIG. 7 is a graph showing the relative yield of repeated growth of CNTs for a number of times over three days compared to an average value (100%). From the graph, it can be seen that the variation in the yield is smaller in the method of the invention (FIG. 7-b) compared with that in the conventional method (FIG. 7-a), that is, the method of the invention is effective for stable growth of the CNTs at high reproducibility.

The invention is also effective to grow CNTs uniformly on the substrate of a large area. In the conventional method, it was difficult to uniformly grow aligned CNT aggregate on a substrate of a large area. This is attributable to that when the feedstock gas and the catalyst activating material are supplied to the substrate 2 as shown in FIG. 3, since they are consumed when they are in contact with the catalyst film surface 2a, the amount of supply of the feedstock gas and the catalyst activating material to the catalyst film surface 2a is different between the peripheral portion and the central portion in the large area substrate. On the contrary, when the method of the invention is used, the feedstock gas and the catalyst activating material can be supplied uniformly and stably to the catalyst film surface 2a also for a large area substrate.

The effect of the method according to the invention that the efficiency of utilizing the feedstock gas and the catalyst activating material is high and the reproducibility of growth is high is provided by the constitution inherent to the invention that the catalyst activating material is supplied rapidly to the catalyst film surface 2a with no contact, for example, with the side wall of the reaction chamber 3. On the contrary, according to the conventional method, since the catalyst activating material is reacted with or absorbed to the side wall, etc. of the reaction chamber 3 before it is in contact with the catalyst film surface 2a, it is not supplied appropriately and stably to the catalyst film surface 2a.

Example 2

As the catalyst activating material, in addition to water vapor, tetrahydrofuran as an ether compound (hereinafter referred to as THF) which is an oxygen containing substance can also provide the same effect as described above. The CNT growth process using THF as the catalyst activating material was adapted as a process equivalent with that of Example 1 of using water vapor excepting that THF was supplied by 30 ppm instead of the water vapor. Also in the conventional method, the process was made equivalent with that of the comparative example in Example 1 of using the water vapor except THF was supplied by 2400 ppm instead of the water vapor.

Figure 8:
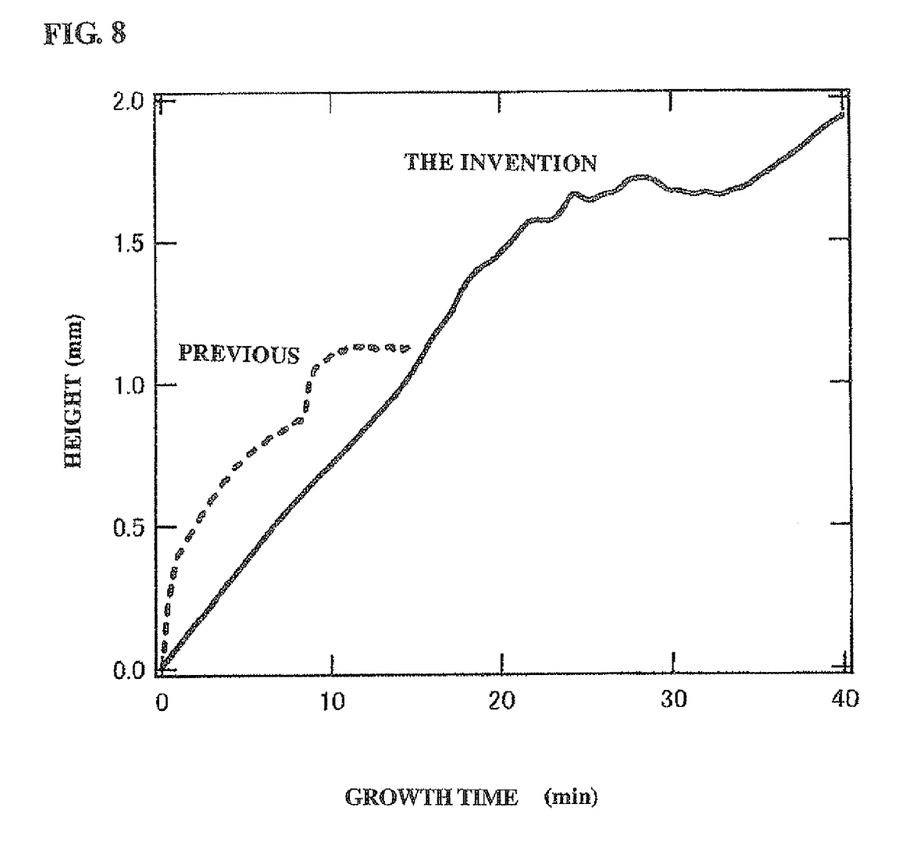
FIG. 8 is a graph comparing a relation of the growing time and the height of CNT when tetrahydrofuran is used as a catalyst activating material between the method of the invention and the conventional method.

FIG. 8 shows a relation of the growth height and the growth time of the aligned CNT aggregate in the method of the invention of supplying the feedstock gas and the catalyst activating material (THF) from the shower head 14 to the catalyst film surface 2a of the substrate 2 and in the conventional method of not using the shower head 14 at all. According to the method of the invention, growth of CNTs was continued even when it exceeded 40 minutes, whereas the growth reached a plateau in about 10 minutes in the conventional method and it has been found that the life time of the catalyst could be extended by the method of the invention also in a case of using THF as the catalyst activating material.

Example 3

In the example described above, a gas mixture of helium and hydrogen was supplied from the other gas supply pipe 6 to the inside of the reaction chamber 3 in the process of supplying the reducing gas (step S2), but it may also be adapted such that all the gases are supplied from a common shower head 14.

Specifically, hydrogen as a reducing gas (feed rate: 500 sccm) was supplied (as a reducing gas) by way of one gas supply pipe 5 from the shower head 14 to the inside of the reaction chamber 3 (quartz tube of 30 mm diameter) and the inside of the reaction chamber 3 was heated to 750° C. A substrate 2 previously deposited with a catalyst film ($Al_2O_3$: 40 nm/Fe: 1.0 nm) by a sputtering vapor deposition method in a separate step was placed on the substrate holder 13 and placed to the downstream from the center of the reaction chamber 3 in the axial direction (first step S1). Then, hydrogen (500 sccm) was supplied by way of one gas supply pipe 5 from the shower head 14 to the inside of the reaction chamber 3 and left for a predetermined time (6 minutes) while maintaining the state at 750° C. (second process S2).

Thus, the catalyst at the catalyst film surface 2a was shaped into fine particles and conditioned to a state suited to grow single-walled CNTs.

Further, ethylene as the feedstock gas (feed rate: 50 sccm) and a carrier gas containing water vapor as the catalyst activating material (relative humidity: 23%, feed rate: 20 sccm) were supplied together with helium as the carrier gas (feed rate: 430 sccm) by way of the one gas supply pipe 5 from the shower head 14 and both of them were blown from the ejection holes 22 of the shower head 14 to the catalyst film surface 2a of the substrate 2 (third step S3).

Figure 9:
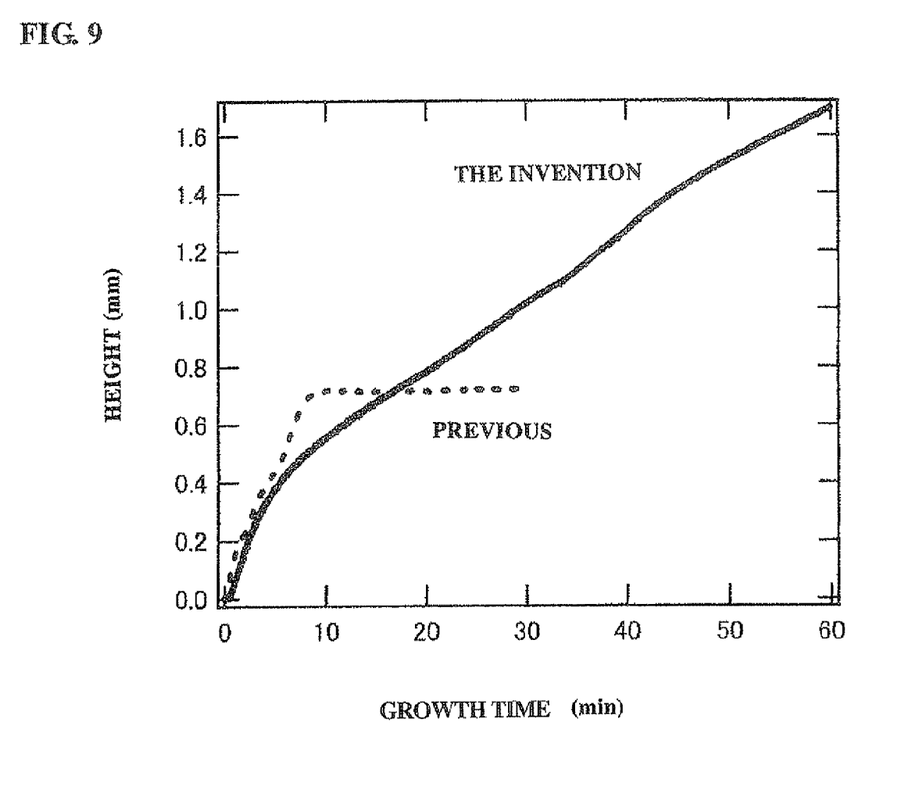
FIG. 9 is a graph for a relation of the growing time and the height of CNT when all gases are supplied from a shower head in comparison with that of the conventional method.

FIG. 9 shows a relation between the growth height and the growth time of the aligned CNT aggregate in the method of the invention of supplying the feedstock gas and the catalyst activating material from the shower head 14 to the catalyst film surface 2a of the substrate 2 and in the conventional method of not using the shower head 14 at all. According to the method of the invention, growth of CNT continued even when after 60 minutes, whereas growing terminated in about 10 min in the conventional method and it has been found that the life time of the catalyst could be extended according to the method of the invention.

CNTs obtained by the manufacturing method of the invention have a purity of 98 mass % to 99.9 mass % without purifying treatment. An aggregate of such CNTs with high purity with very small impurities can provide properties inherent to the CNT. The purity is a value determined based on the result of elemental analysis using fluorescence X-rays.

In the CNTs obtained by the manufacturing method of the invention, when manufactured as single-walled CNTs, the specific surface area is extremely large which is from 600 to 1300 $m^2$/g for unopened products. The specific surface area of the unopened products can be increased by applying an opening treatment.

As the opening treatment, a dry process using oxygen, carbon dioxide or water vapor, or a reflux treatment with hydrogen peroxide, and a wet process using a cutting treatment with high temperature hydrochloric acid, etc. have been known. In a case of applying the opening treatment, the specific surface area can be from 1300 to 2500 $m^2$/g.

The value for the specific surface area was determined by measuring a liquid nitrogen adsorption/desorption isotherm at 77K using BELSORP-MINI manufactured by Bell Japan Inc. and measuring the specific surface area based on the adsorption/desorption isotherm.

The CNT aggregate obtained by the manufacturing method of the invention can provide high alignment and provide anisotropy for electric properties (for example, electric conductivity), optical properties (for example, transmittance), and mechanical properties (for example, Young's modulus) between the direction of alignment and the direction perpendicular thereto. The degree of the anisotropy is 1:3 or more and the upper limit value thereof is about 1:100.

From the foregoings, when compared with the conventional method of supplying the feedstock gas and the catalyst activating material from one end wall of the reaction chamber 3 only by way of a single nozzle (opening of the other gas supply pipe 6), it has been found that according to the method of the invention of supplying at least the feedstock gas and the catalyst activating material from the shower head 14, the life time of the catalyst is extended to continue the growth of CNTs for a long time and the consumption amount of the feedstock gas and the catalyst activating material is decreased and, as a result, CNTs can be manufactured in a remarkably great amount, at a reduced cost and stability. Further, it has been found that the obtained CNT aggregate is excellent in the purity, the specific surface area, and the alignment.

The CNTs obtained by the manufacturing apparatus and the manufacturing method of the invention can provide single-walled carbon nanotubes selectively but it is also possible to selectively manufacture double-walled carbon nanotubes or multi-walled carbon nanotubes respectively by controlling the thickness of the catalyst film.

The invention claimed is:

1. A method of producing aligned carbon nanotubes, comprising:
   depositing a metal catalyst film comprised of $Al_2O_3$—Fe on a substrate disposed in a reaction chamber;
   adjusting a metal catalyst forming the metal catalyst film into metal catalyst fine particles with a density of $1.0 \times 10^{11}$(N/cm$^2$) to $1.0 \times 10^{13}$(N/cm$^2$) by supplying a reducing gas toward the metal catalyst film; and
   growing the aligned carbon nanotubes from the metal catalyst fine particles by supplying a feedstock gas and a catalyst activating material toward the metal catalyst fine particles, and selectively manufacturing single-walled carbon nanotubes, double-walled carbon nanotubes or multi-walled carbon nanotubes by controlling a thickness of the metal catalyst film,
   wherein the feedstock gas and the catalyst activating material are supplied toward the metal catalyst fine particles in the reaction chamber from ejection holes of a shower head provided with a plurality of the ejection holes disposed so as to face the metal catalyst fine particles formed from the metal catalyst film.

2. The method of producing aligned carbon nanotubes according to claim 1,
   wherein the plurality of the ejection holes of the shower head are arranged in a uniformly distributed manner so that a gas stream is not hindered by the growing carbon nanotubes.

* * * * *